United States Patent
Fusegawa et al.

(10) Patent No.: US 6,592,662 B2
(45) Date of Patent: Jul. 15, 2003

(54) METHOD FOR PREPARING SILICON SINGLE CRYSTAL AND SILICON SINGLE CRYSTAL

(75) Inventors: Izumi Fusegawa, Fukushima (JP); Ryoji Hoshi, Fukushima (JP); Kouichi Inokoshi, Fukushima (JP); Tomohiko Ohta, Fukushima (JP)

(73) Assignee: Shin-Etsu Handotai Co., Ltd., Tokyo (JP)

( * ) Notice: Subject to any disclaimer, the term of this patent is extended or adjusted under 35 U.S.C. 154(b) by 0 days.

(21) Appl. No.: 09/959,381

(22) PCT Filed: Feb. 27, 2001

(86) PCT No.: PCT/JP01/01460
§ 371 (c)(1),
(2), (4) Date: Oct. 24, 2001

(87) PCT Pub. No.: WO01/63027
PCT Pub. Date: Aug. 30, 2001

(65) Prior Publication Data
US 2002/0157600 A1 Oct. 31, 2002

(30) Foreign Application Priority Data
Feb. 28, 2000 (JP) ........................................ 2000-052540

(51) Int. Cl.[7] .......................... C30B 15/00; C30B 15/20
(52) U.S. Cl. ............................. 117/13; 117/30; 117/32; 117/917
(58) Field of Search ......................... 117/13, 30, 32, 117/917, 19

(56) References Cited

U.S. PATENT DOCUMENTS 5,359,959 A * 11/1994 Fusegawa et al. ............. 117/13

FOREIGN PATENT DOCUMENTS

| JP | 56-104791 | | 8/1981 |
|---|---|---|---|
| JP | 03-159986 | * | 9/1991 |
| JP | 4-31386 | | 2/1992 |
| JP | 5-194077 | | 8/1993 |
| JP | 9-235192 | | 9/1997 |
| JP | 11228286 A | * | 8/1999 |
| JP | 2000086392 | | 3/2000 |
| JP | 2000239096 | | 9/2000 |

OTHER PUBLICATIONS

"The effects of argon gas flow rate and furnace pressure on oxygen concentration in Czochralski silicon simple crystals grown in a transverse magnetic field," Machida, et al; J. of Crystal Growth 210 (2000); pp. 532–540. Sep. 1999.*

"The effects of argon gas flow rate and furnace pressure on oxygen concentration in Czochralski–grown silicon single crystals," Machida, et al., J. of Crystal Growth 186 (1998) pp. 362–368. Aug. 1997.*

Koji Sumino, "Dislocation Behavior and Mechanical Strengths of Float–Zone Silicon Crystals and Czochralski Silicon Crystals," *Semiconductor Silicon 1981*, ed. Howard R. Huff, et al., pp. 208–219, Pennington, NJ: The Electrochemical Society, Inc.

* cited by examiner

*Primary Examiner*—Felisa Hiteshew
(74) *Attorney, Agent, or Firm*—Snider & Associates; Ronald R. Snider

(57) ABSTRACT

In a method manufacturing a silicon single crystal 8 according to an MCZ method, a flow rate of an inert gas flowing in a growth furnace 1 during growth of the silicon single crystal 8 and/or a pressure in the growth furnace 1 is altered according to a pulling amount of the silicon single crystal 8 to adjust an interstitial oxygen concentration therein. By altering a flow rate of an inert gas flowing in the growth furnace or a pressure therein, an amount of oxygen evaporating as an oxide from a surface of a silicon melt 10 in the vicinity of a crystal growth interface can be easily adjusted, and thereby, an oxygen amount included in the silicon melt 10 can be controlled with ease.

17 Claims, 6 Drawing Sheets

METHOD FOR PREPARING SILICON SINGLE CRYSTAL AND SILICON SINGLE CRYSTAL

FIELD OF THE INVENTION

This invention relates to a manufacturing method for a silicon single crystal, using a CZ method (a Czochralski Method) pulling the silicon single crystal from a silicon metal contained in a crucible. More particularly, the invention relates to a method obtaining a high quality silicon single crystal by controlling an interstitial oxygen concentration in the silicon single crystal with a high precision and a silicon single crystal that can be realized by the method for the first time.

DESCRIPTION OF THE BACKGROUND ART

In order to produce a silicon single crystal wafer used in fabrication of semiconductor devices, there has been widely used a silicon single crystal manufactured by a Czochralski method (hereinafter also referred to as a CZ method or a pulling method), which is advantageous in growing a large size crystal. A manufacturing method according to the Czochralski method is, as is well known to the general public, such that a seed crystal is dipped into a silicon melt obtained by melting in a quartz crucible of a single crystal growth apparatus and thereafter, the dipped seed crystal in the melt is slowly pulled upward while rotating the seed crystal in a direction opposite to that of the quartz crucible, resulting in growth of a silicon single crystal in an almost cylindrical shape.

Since a quartz crucible is used for holding a silicon melt in a manufacturing method for a silicon single crystal according to a Czochralski method, the quartz of a crucible wall reacts with the silicon melt to dissolve oxygen atoms into the silicon melt and ad as a result, the silicon is incorporated into the single crystal during growth through the melt. For this reason, a silicon single crystal manufactured by a CZ method includes oxygen atoms in supersaturation and a mechanical strength of the silicon single crystal in processing into wafers increases in the presence of the oxygen atoms in supersaturation. Therefore, characteristically, not only does a silicon wafer from such a single crystal come to have a large resistance force against various thermal strains received when the semiconductor elements are fabricated thereon, but dislocations such as slippage are also difficult to be produced therein (see K. Sumino: Semiconductor Silicon 1981, Electrochem. Soc., Penington 1981 p. 208).

Furthermore, while oxygen in super saturation existing in a wafer is transformed into oxide precipitates (bulk micro defects, which is hereinafter abbreviated as BMD) by a heat treatment of the wafer after a single crystal is processed into wafers, but in a case where BMDs are introduced in a region remote from an element forming region in a surface layer of the silicon wafer, the BMDs serves as getter sinks collecting impurities existing in the wafer and therefore, capture various impurities introduced into a wafer during an element's forming process, thus performing a role to keep clean the element forming region. This method is called intrinsic gettering (hereinafter abbreviated as IG) and IG has been widely used as a gettering method when elements are fabricated on a wafer.

However, on the other hand, as interstitial oxygen existing in a wafer increases, a forming amount of BMDs also increase and with the forming amount in excess, especially, in a wafer surface layer which is an element forming region, the BMDs are a cause for a leakage failure at element junction interfaces, which in turn invites deterioration in element characteristics, resulting in loss of an essential function of a semiconductor integrated circuit by chance. Therefore, it is very important when semiconductor elements are fabricated in the surface layer of a wafer to keep an interstitial oxygen concentration in a CZ method silicon single crystal at a proper value, which produces a problem of how to control an interstitial oxygen concentration in a crystal at proper value in order to take care of a high density and high degree of integration of a semiconductor device, such that the control of an interstitial oxygen concentration have further become an important factor in maintaining a product quality of an integrated circuit.

In growth of a silicon single crystal by a CZ method, as an amount of a silicon melt contained in a quarts crucible decreases, a contact area between a wall of the quartz crucible and the silicon melt decreases. As a result, oxygen dissolved from the crucible wall also decreases, in turn an oxygen concentration in the latter half of a grown crystal decreases to a value equal to or less than a desired value, and thereby, there arises a chance to be unable to ensure a necessary quality. As a measure to improve this problem, proposal has been made on a method for adjusting an amount of oxygen supplied into the silicon melt from the quartz crucible wall by increasing a rotation speed of a crucible with progress in growth of a single crystal, that is as a pulled amount of a single crystal ingot is increased.

In this method, however, it has been said to be hard to achieve a high precision control of an interstitial oxygen concentration adapting to growth of a single crystal since, in a quartz crucible of as large a size as a diameter in excess of 200 mm, there exists a distance between a crucible wall supplying oxygen and a crystal growth interface, which in turn causes a delay in time for a melt to reach the crystal growth interface. As a result, in a case where a large size crystal equal to or more than, especially, 200 mm in diameter is pulled, there has been an inevitable limitation on control to suppress variations in interstitial oxygen concentration due to the above inconvenience.

On the other hand, as a method for controlling an interstitial oxygen concentration in a silicon single crystal, there is disclosed in JP A 81-104791, for example, a MCZ method whereby to grow a single crystal under application of a magnetic field (a magnetic field applied Czochralski method, which is also called magnetic field applied pulling method), in which a proposal is made on a technique that an interstitial oxygen concentration is efficiently reduced. In one aspect of this method, however, somewhat troublesome faults have been encountered in setting of and adjustment for growing conditions of a single crystal since an oxygen concentration is excessively low by chance depending on growth conditions for a single crystal when a BMD density is desired at a necessary and sufficient level in a wafer, therefore, a special technique is required to be performed for achieving a high oxygen concentration on a specific target quality of a crystal and a growth state of the crystal.

As a means for solving such problems, methods have been proposed: one of JP A 92-31386 in which a magnetic field is altered in strength according to a growth length of a crystal such that an interstitial oxygen concentration along the crystal growth axis direction is kept constant and the other of JP A 93-194077 in which a rotation speed of a crucible filled with a melt is controlled so as to adjust an oxygen concentration in a grown crystal.

In growth of a silicon single crystal according to a MCZ method, interstitial oxygen existing in a silicon single crystal originates from oxygen in the silicon melt dissolved from a quartz crucible, similar to an ordinary CZ method, and the oxygen in the melt is incorporated into the crystal through a crystal growth interface. In the MCZ method, however, by growing a silicon single crystal under application of a magnetic field to a silicon melt, a turbulent in the melt produced by thermal convection in the melt and rotation of a crucible can be efficiently suppressed, so an amount of oxygen supplied to a region in the vicinity of a crystal growth interface is caused low, with the result that a single crystal of a low oxygen concentration can be grown. This is a mechanism enabling a low oxygen crystal to be grown in an MCZ method.

According to a prior art MCZ method, however, in use of a large size quarts crucible for growth of a single crystal as large a diameter as to exceed 200 mm, as described above, convection in a silicon melt is extremely suppressed by a magnetic field and thereby, more of a delay in time arises for a melt portion on a crucible wall surface to reach a growth interface, which in turn results in more of difficulty in terms of high precision control of an interstitial oxygen concentration adapting to growth of a crystal. In fact, a method is disclosed in JP A 97-235192, in which rotation speeds of a crucible and a single crystal are adjusted in respective predetermined ranges in order to suppress variations in an interstitial oxygen concentration along the growth axial direction when a silicon single crystal is pulled by a MCZ method. According to the disclosed technique, even in a small diameter silicon single crystal of the order 6 inches (about 150 mm) in diameter, a variation in the concentration still remains at an extent of within $\pm 0.05 \times 10^{18}$ atoms/cm$^3$ ($\pm 0.5 \times 10^{17}$ atoms/cm$^3$), from which expectation is deduced that more of a variation will be produced for a larger diameter silicon single crystal. Note that, in a MCZ method, although a proposal is made on a method adjusting an oxygen amount supplied into a silicon melt from a crucible wall in which as an pulling amount of a single crystal ingot increases, a magnetic field applied to the silicon melt is reduced in strength, this has not been able to be a decisive solution as great as to be dramatic improvement of suppression of variations in interstitial oxygen concentration in pulling a single crystal of equal to or more than 200 mm in diameter either.

The invention has been made in light of the above problems and it is accordingly an object of the present invention to provide a manufacturing method for a high quality silicon single crystal whose interstitial oxygen concentration along a crystal growth axis direction is controlled with a high degree of precision and provide a silicon single crystal obtained by the same method.

DISCLOSURE OF THE INVENTION

In order to solve the above problem, the invention is directed to a method for manufacturing a silicon single crystal from a silicon melt contained in a crucible in a silicon single crystal growth furnace by a CZ method in which not only is a MCZ method (a magnetic field applied pulling method) performing single crystal pulling under application of a magnetic field adopted, but also a flow rate of an inert gas flowing in the growth furnace during growth of the silicon single crystal and/or a pressure in the growth furnace is altered according to a pulling amount of the silicon single crystal to adjust an interstitial oxygen concentration therein.

In the invention, in order that an oxygen concentration in a silicon single crystal obtained by a CZ method (a Czochralski method) is restricted to a predetermined level or less during pulling of the silicon single crystal, and that a concentration of oxygen incorporated into the silicon single crystal is stabilized, the growth of a silicon single crystal is performed while suppressing convection in a melt with adoption of an MCZ method. As a method unique to the invention, a flow rate of an inert gas flowing in the growth furnace during growth of the silicon single crystal and/or a pressure in the growth furnace is altered according to a pulling amount of the silicon single crystal, thereby, enabling a suppressed level of variations in interstitial oxygen concentration, which was regarded as impossible in a CZ method in the prior art, to be realized.

Furthermore, a silicon single crystal of the invention can be realized for the first time by adoption of the manufacturing method of the invention, which is a silicon single crystal of 200 mm or more in diameter grown using a CZ method pulling a single crystal from a silicon melt having a variation in interstitial oxygen concentration at a center of a single crystal along the crystal growth axis direction confined within $\pm 0.2 \times 10^{17}$ atoms/cm$^3$ of the average thereof contrary to the average oxygen concentration at a center of the crystal growth axis. Note that in this specification, an interstitial oxygen concentration is a measurement obtained according to a method stipulated in F-121 of ASTM (1979). Especially, in a large diameter single crystal of 200 mm or more (for example, 8 inches), 250 mm or more (for example, 10 inches) or 300 mm or more (for example, 12 inches), it was traditionally very difficult to restrict variations in interstitial oxygen concentration to a sufficiently low level even by adopting an MCZ method. By adoption of a manufacturing method of the invention, however, it can be realized to very effectively suppress variations in interstitial oxygen concentration of a single crystal in such a large diameter, thereby enabling a single crystal having a variation within the above numerical range to be actually obtained. Note that it is practical in growth of a silicon single crystal that an average (that is the central value of variations) of values of an interstitial oxygen concentration in all of the silicon single crystal is controlled on the order in the range of from $6 \times 10^{17}$/cm$^3$ to $12.5 \times 10^{17}$/cm$^3$, which are practical variations for the range of low oxygen concentration in growth of a silicon single crystal. According to a manufacturing method of the invention, by altering a flow rate of an inert gas flowing in the growth furnace during growth of a silicon single crystal and/or a pressure in the growth furnace according to a pulling amount of the silicon single crystal, an oxygen concentration in the melt can be efficiently adjusted with less of a delay in time compared with a method using a change in magnetic field or a method for controlling an oxygen concentration by adjusting a rotation speed of a crucible; therefore a concentration of oxygen incorporated into the crystal can be stabilized. According to the above manufacturing method, by altering a flow rate of an inert gas flowing in the growth furnace during growth of the silicon single crystal or a pressure in the growth furnace, an amount of oxygen evaporating as an oxide from a surface of the melt in the vicinity of a crystal growth interface can be easily adjusted, and thereby, an oxygen amount included in the silicon melt can be controlled with ease. Furthermore, by adopting such a method, an oxygen concentration in the surface layer of the silicon melt can be controlled with more of ease, thereby, enabling control of an oxygen amount in the melt existing in the vicinity of a crystal growth interface with a good precision.

In the manufacturing method for a silicon single crystal of the invention, a flow rate of an inert gas flowing in the growth furnace can be reduced as a pulling amount of the silicon single crystal increases. With progress in growth of the crystal, a silicon melt in a crucible decreases and in turn a contact area between a crucible wall and the silicon melt decreases, which causes an oxygen amount of supply from the crucible to be reduced. Therefore, by decreasing a flow rate of an inert gas flowing in the growth furnace, for example an inert gas flowing down toward the melt surface from above in the growth furnace, an amount of SiO (silicon monoxide) evaporated off away from the melt surface by the inert gas decreases, thereby enabling prevention of reduction of an oxygen concentration in the surface layer of the melt to a value equal to or less than a desired value. With such a technique adopted, an oxygen concentration in the melt in the vicinity of a crystal growth interface is kept at a proper value and alteration in oxygen concentration in the crystal occurring in company with decrease in the melt can be effectively suppressed. The invention can be effectively adopted in a case where a large diameter crystal of 200 mm or more in diameter is grown by use of an especially large size quartz crucible (for example, with a diameter of 500 mm or more).

In this case, a flow rate of an inert gas flowing in the growth furnace during growth of a silicon single crystal is desirably adjusted in the range of from 40 to 300 l/min. With no relation to an amount of a melt in a crucible, an effect of removing an oxide evaporating from the surface of the melt becomes low with a flow rate of the inert gas flowing in the furnace equal to or less than 40 l/min and thereby, a case arise by chance where it is hard to properly control an oxygen concentration in the melt. Furthermore, an effect of removing an oxide evaporating off away from the melt becomes low; therefore, not only does the upper end of a quarts crucible and an oxide attach onto portions which have low temperature in the growth furnace to contaminate the inner structure of the growth furnace, but also the attachment has a chance to fall onto the surface of the melt to disturb cystallization of silicon. On the other hand, the inert gas flow rate more than necessary is also problematic. When an amount of the inert gas is in excess, an amount of oxygen to be removed from the melt surface increases and an amount of oxygen supplied from the crucible increases in a corresponding manner, whereby deterioration of a quartz crucible is accelerated, resulting in difficulty in operation for a long time. Furthermore, when an amount of the inert gas flowing over the melt surface increases, ripples arise on the melt surface, by which there arises a fear that the ripples produce an inconvenience such as to create dislocations in a single crystal in growth and further, which brings a disadvantage in an aspect of manufacture cost because of increase in consumption of the inert gas. From this viewpoint, a flow rate flowing in the furnace is desirably in the range of 300 l/min or less and more desirably in the range of from 60 to 200 l/min. Note that a flow rate of an inert gas flowing in the furnace has a chance that a more desirable numerical range thereof differs according to a size of a growth furnace, a size of a crucible and a diameter of a silicon single crystal to be grown. To be concrete, the upper limit of a gas flow rate during crystal growth in a growth furnace has a character to shift upward with increase in volume thereof and, for example, a flow rate of an inert gas can have, in a good probability, a case to exceed 300 l/min in a large size growth furnace by which a single crystal having a diameter exceeding 300 mm is grown. However, with a growth furnace having any larger size, when a silicon single crystal is grown using an MCZ method therein, by controlling a flow rate of an inert gas flowing in the growth furnace so as to match with a pulling amount of the single crystal, an interstitial oxygen concentration in the single crystal can be controlled properly, which circumstances do not change by a size of the growth furnace.

An inert gas flowing in the growth furnace is preferably argon gas. When the inert gas is argon gas, not only can stable crystal growth be ensured without performing an unnecessary chemical reaction in the growth furnace, but also an influence on a crystal quality is small, thereby enabling a high quality crystal to be obtained.

Furthermore, in a manufacturing method for a silicon single crystal of the invention, a pressure in a crystal growth furnace can also be increased with increase in a pulling amount of the silicon single crystal. As a pulling amount of the silicon single crystal increases, an amount of a melt decreases, thereby, reducing an oxygen concentration in the melt. By increasing a pressure in the growth furnace, however, an amount of SiO evaporating from the surface of the melt can be suppressed. Therefore, when a pressure in the growth furnace is raised so as to match with growth of the silicon single crystal, an evaporation amount of SiO decreases to stabilize an oxygen amount in the silicon melt. A method for controlling an oxygen concentration by adjusting a pressure in a growth furnace has an effect of suppressing consumption of an inert gas because of no relation with an amount of the inert gas flowing in the furnace and is also excellent in an aspect of manufacturing cost of a single crystal. A pressure in a growth furnace during growth of a silicon single crystal is preferably adjusted in the range of from 40 to 300 mbar. Under a pressure in the growth furnace of 40 mbar or less, an amount of an oxide such as SiO evaporating off away from the surface of a melt increases to a level in excess of a necessary value and an amount of supply of oxygen from a quartz crucible wall increases to thereby deteriorate a durability of the crucible; therefore, there arise a case where single crystal growth over a long time becomes difficult. On the other hand, in a case where operation is performed under a condition in excess of 300 mbar, while an amount of oxide evaporating from the melt can be suppressed, a pressure in the growth furnace becomes excessively high, whereby SiO attaches on a furnace wall, a hot zone (a structure in the furnace) and others to disable visual observation in the furnace or crystal growth suffers falling-off of the attached SiO onto the melt resulting in disturbance of growth of a crystal by chance, which is not preferable from the viewpoint of actual operation. A pressure in the growth furnace is desirably adjusted in the range of from 60 to 200 mbar.

Then, since, by using a method of the invention, an oxygen concentration included in a melt in the vicinity of a growth interface can be directly controlled, therefore, control of an oxygen concentration with no delay in time can be realized, thereby enabling control of oxygen incorporated into the crystal with good precision. Especially in growth of a large size single crystal of 200 mm or more (for example, 8 inches or more) in diameter, a high strength magnetic field is applied to perform an operation; therefore, the effect of the present invention is exerted conspicuously. To be concrete, a case can be exemplified in which an operation is performed under a condition that a magnetic field applied to a silicon melt in a growth furnace growing a silicon single crystal therein has a strength of 3000 G or higher at a position where the magnetic field reaches the maximum strength thereof, wherein the strength 3000 G is a magnetic field strength expressed in terms of a magnetic flux density with a gauss as a unit. Note that while there is no special value of the upper limit as a value of the magnetic field, the upper limit is preferably selected on the order of 10000 G as a practical range in consideration of a size, a running cost of a magnetic field generation apparatus and others.

As a magnetic field applied to a silicon melt in a growth furnace growing a silicon single crystal, for example, a horizontal magnetic field can be adopted. In this case, growth of a large size single crystal as described above is desirably performed at a central magnetic field strength of the horizontal magnetic field of 3000 G or more, wherein the central magnetic field strength corresponds to the maximum magnetic field strength. In a CZ method performing crystal growth under application of a horizontal magnetic field, an effect of suppressing convection throughout all of the bulk of a melt in a quarts crucible is exerted under an influence of the horizontal magnetic field. Especially, since the center of the magnetic field is located on a crystal growth axis in the melt, a suppressing effect on convection in the vicinity of a crystal growth interface is large and it takes a time from when a rotation speed of a crucible is altered till an influence of the change in rotation speed is exerted on an oxygen concentration in the melt in the vicinity of a crystal growth interface, having resulted in a problem in regard to precise control of an amount of oxygen incorporated into a crystal. By adopting of a manufacturing method of the invention, however, such a problem can be solved effectively.

In a manufacturing method of the invention, a flow rate of an inert gas and/or a pressure in a growth furnace to be altered so as to match with a pulling amount of a single crystal can be calculated based on measurements of an interstitial oxygen concentration in silicon single crystals having been pulled in a previous time. In growth of a silicon single crystal using a manufacturing method of the invention, by performing setting and adjusting current growth conditions based on oxygen concentration data on silicon single crystals pulled in a previous time and operating condition data such as a flow rate of an inert gas, a pressure in a growth furnace and others in the previous time of the growth, a single crystal with a more stable quality can be obtained. That is, if a portion in a low oxygen concentration exists in a part of a grown single crystal; in the next run of crystal growth, growth conditions can be adjusted such that a flow rate of an inert gas is reduced at a timing just when the part in a low oxygen concentration is in the growth or a pressure in the furnace is increased at the same timing. Contrary to this, in a part where an oxygen concentration is higher than a target value, if an adjustment of operating conditions is performed such that a gas flow rate increases or a pressure in the furnace decreases, thereby, a single crystal can be easily obtained with a stable oxygen concentration distribution along a crystal axis direction with ease. Note that the gas flow rate and the pressure in the furnace can be adjusted simultaneously.

BEST MODE FOR CARRYING OUT THE INVENTION

Figure 1:
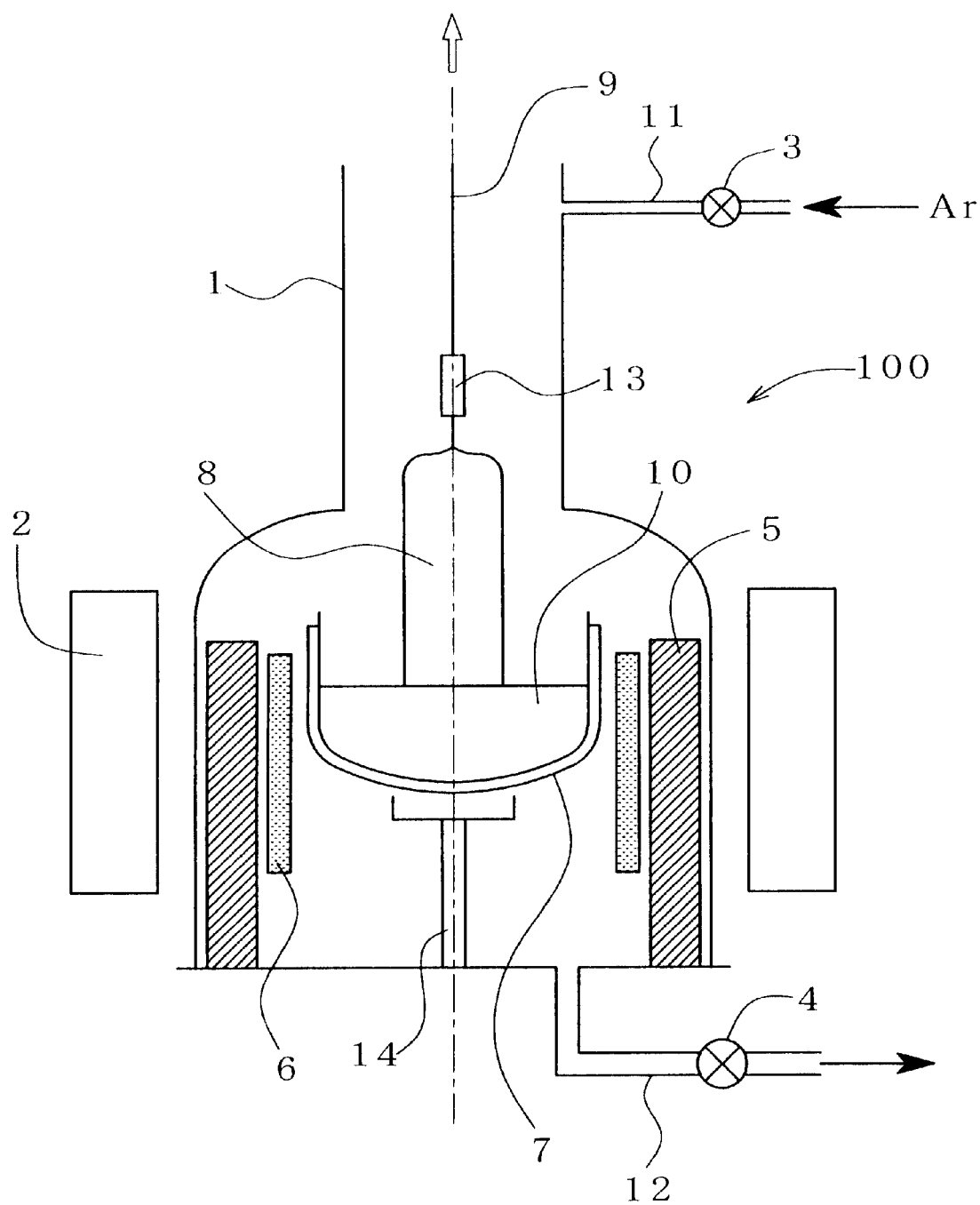
FIG. 1 is a schematic view showing an example of a manufacturing apparatus for a silicon single crystal of the invention.

Description will be given of concrete embodiments of the invention below with reference to the accompanying drawings and it should be noted that the invention is not limited by the description thereof. FIG. 1 is a schematic view showing an example of a growth apparatus for a silicon single crystal used in the embodiment. A single crystal growth apparatus 100 is equipped with a growth furnace 1 and a magnetic field generation apparatus 2 surrounding the growth furnace 1, and the interior of the growth furnace 1 is constructed of a crucible 7 having the inside made of quartz and the outside made of graphite, and for holding a silicon melt 10; a heater 6 for heating and melting silicon in the crucible 7; an heat insulating material 5 for protecting the inner wall of the growth furnace 1 such that no radiation heat from the heater 6 impinges directly thereon. A wire 9 for pulling a single crystal is wound out from a wire take-up mechanism, not shown, mounting on an upper portion of the growth furnace 1 and a seed holder 13 for mounting a seed crystal is anchored at a fore end of the wire 9. A crucible shaft 14 for supporting the crucible 7 is provided at a lower portion of the growth furnace and the crucible shaft 14 can vertically shift and rotate by a crucible drive mechanism, not shown, connected to the crucible shaft 14. Furthermore, attached to the growth furnace 1 are a introduction pipe 11 for introducing an inert gas from an upper portion of the growth furnace and an exhaust gas pipe 12 for discharging the inert gas having flown into the furnace from the introduction pipe 11 to outside the growth furnace, and furthermore, mounted on the introduction pipe 11 and the exhaust gas pipe 12 are respective flow rate/pressure adjustment mechanisms including, for example, pairs of a flow rate controller 3 and a conductance valve 4. By operating the flow rate/pressure adjustment mechanisms, a flow rate of an inert gas flowing in the growth furnace 1 and a pressure therein can be adjusted to respective desired values.

Growth of a silicon single crystal 8 can be performed in the following way: At first, a seed crystal is attached to the seed holder 13 at the fore end of the wire 9 (wound out from a wire take-up mechanism located at an upper portion of the growth furnace 1, as described above). On the other hand, polycrystalline raw material being put in the crucible 7 is melted by heating with the heater 6. After the raw material is melted completely, the wire 9 is slowly wound out such that a fore end of the seed crystal comes to touch the silicon melt 10 and then, the wire 9 is slowly wound in the take-up mechanism while rotating, thereby causing a single crystal to grow at the fore end of the seed crystal. At this time, while the crucible 7 is rotated in an opposite direction of the crystal in growth, rotation of the crucible 7 is adjusted in a proper manner to thereby control a dissolution speed of oxygen from a quartz crucible engaged inside the crucible 7 in order to adjust an oxygen amount to be introduced into a silicon single crystal to a desired value. Furthermore, since a necessity arises for keeping the surface of the melt at a constant level in order to keep a diameter of a crystal in growth at a constant value, the crucible 7 is shifted upward by a distance corresponding to a reduction in height of the surface of the melt caused by pulling the crystal with a crucible drive mechanism, not shown, to keep the surface of the melt at a constant height at all times.

The silicon melt 10 thus obtained by melting with the heater 6 is applied with a magnetic field by the magnetic field generation apparatus 2. By application of a magnetic field to the melt 10, convection in the melt in the crucible 7 is suppressed and thereby, deterioration of a quartz crucible wall inside the crucible 7 can be suppressed. Furthermore, since, by suppressing convection, variations in temperature in the melt 10 can also be suppressed to ensure an operation in a stable manner, an MCZ method growing a single crystal under application of a magnetic field to the melt 10 is suited for growth of a large-diameter, long single crystal ingot.

Note that a kind of magnetic field applied to the melt 10 can be selected as any of a horizontal magnetic field, a vertical field, a cusp magnetic field and others using the magnetic field generation apparatus 2 outside the growth furnace 1. In a case where any type of magnetic fields is selected, convection in the melt 10 is suppressed by application of a magnetic field and thereby, deterioration of a quartz crucible wall can be suppressed to ensure a long time operation; and in addition, by suppressing convection in the melt 10 and simultaneously stabilizing a temperature of the melt in the vicinity of a crystal growth interface, no introduction of slip dislocations to a single crystal is assured, and thereby, crystal growth with good efficiency is enabled, with the result that an essentially similar effect can be attained. Experiments described later were performed in a single crystal growth apparatus using an MCZ method in which a horizontal magnetic field widely spread was applied to grow a single crystal ingot. As described above, however, according to the invention, no difference exists between effects obtained from ways that a magnetic field is adopted; a similar effect can be obtained from any of a vertical magnetic field and a cusp magnetic field.

In order to discharge an oxide and impurities evaporated from the melt 10 during crystal growth to outside the furnace, argon gas is introduced into the furnace 1 through the introduction pipe 11 for an inert gas mounted on an upper portion of the growth furnace 1, caused to be flown downward toward the surface of the melt from above the melt 10 and discharged from the exhaust pipe 12 provided in a lower portion of the growth furnace. With such a flow of the inert gas, the oxide and other impurities evaporating from the silicon melt 10 are discharged to outside the growth furnace. An amount of argon gas introduced from the upper portion of the furnace can be adjusted by the flow controller 3 mounted on the gas introduction pipe 11 and the adjustment is performed according to growth conditions for a single crystal and a situation in the furnace. On the other hand, a pressure in the growth furnace is selected to a level necessary for when in crystal growth by adjusting a degree of opening of the conductance valve 4 mounted on the discharge gas pipe 12. Note that in order to discharge gas in the furnace efficiently, it is effective to grow a single crystal on a condition that a pressure in the growth furnace 100 is set lower than that outside the single crystal growth apparatus. In the embodiment of the invention, a flow rate of argon gas supplied from the upper portion of the growth furnace 1 is controlled according to a pulling length of a single crystal. Control of the gas flow rate according to pulling along a crystal growth axis direction is to control such that, for example, as the silicon single crystal 8 is pulled, the flow rate is reduced, and a timing at which to decrease the gas flow rate and a magnitude of the decrease are properly selected according to conditions of sizes of the growth furnace 1 and the crucible 7, an amount of the silicon melt 10, a diameter and length of the silicon single crystal 8, a way of application of a magnetic field and a strength thereof, a rotation speed of the crucible 7 and others. By causing argon down from the upper portion of the growth furnace 1 to flow over the surface of the silicon melt 10, oxygen evaporating from the surface of the silicon melt 10 in the form of an oxide can be efficiently discharged to outside the growth furnace 1. As a pulling amount of the silicon single crystal 8 increases, a contact area between the silicon melt 10 and a quartz crucible wall engaged inside the crucible 7 decreases and oxygen incorporated into the silicon melt 10 also decreases. Accordingly, by suppressing a flow rate of argon gas matching with progress in growth of the silicon single crystal 8, an amount of oxygen removed from the silicon melt surface can be decreased; and by adopting such a method, high precision control can be achieved of an interstitial oxygen concentration with no delay in time.

Furthermore, in the invention, a pressure in the growth furnace obtained by adjusting a degree of opening of the conductance valve 4 is also controlled according to a pulling length of the silicon single crystal 8. Control of a pressure in the growth furnace 1 in which the pressure is altered according to a pulling amount in the crystal growth axis direction can be realized in an operation in which, for example, as the silicon single crystal 8 is pulled, the pressure is increased. A timing at which the pressure is raised and an extent to which the pressure is raised are properly selected, as in the case of the gas flow rate, according to conditions of sizes of the growth furnace 1 and the crucible 7, an amount of the silicon melt 10, a diameter and length of the silicon single crystal 8, a way of application of a magnetic field and a strength thereof, a rotation speed of the crucible 7 and others. By raising a pressure in the growth furnace 1 with progress in growth of a crystal, an amount of oxygen evaporating from the surface of the silicon melt 10 as an oxide is suppressed. As described above, as a pulling amount of the silicon single crystal 8 increases, a contact area between the silicon melt 10 and the quartz crucible wall decreases, thereby decreasing an amount of supply of oxygen to the silicon melt 10. Therefore, by suppressing evaporation of oxygen atoms to the environmental atmosphere according to a pulling amount of the silicon single crystal 8, an amount of oxygen removed from the surface of the melt decreases and as a result, high precision control of an interstitial oxygen concentration can be realized with no delay in time.

Especially, in the embodiment, since a control of a flow rate of the inert gas is performed in parallel to control of a pressure in the furnace in combination therebetween, a concentration of interstitial oxygen incorporated into the silicon single crystal 8 can be held with high precision in a stable manner along the crystal growth axis direction. Accordingly, in a case where a single crystal is grown with a MCZ method growing a single crystal under application of a magnetic field, a high precision and stable control of oxygen concentration can be performed with less of delay in time in a method of the invention compared with a method in which oxygen is incorporated into a single crystal in growth by adjusting a rotation speed of a crucible and adjustment of a magnetic field strength is applied to the melt. Note that in adjustment of a flow rate of an inert gas and a pressure in the growth furnace, the flow rate and the pressure in the furnace may be simultaneously adjusted or singly adjusted to control oxygen incorporated into the crystal. For example, in the method in which the gas flow rate and the pressure in the furnace are simultaneously adjusted, although sequences for adjustment becomes somewhat more complex, a range in which an amount of oxygen can be controlled is wide and there can be enjoyed an advantage that an amount of oxygen can be controlled close to an optimal value with more of ease, while in the method in which the flow rate and the pressure in the furnace are singly controlled, a range in which an amount of oxygen can be controlled is somewhat narrowed, but contrary to this, the method is convenient for fine adjustment of an amount of oxygen in the melt. In such a way, both methods have respective features and are to be selected in proper manner according to a target oxygen concentration in a crystal.

In setting a flow rate of argon gas and a pressure in the furnace, it is desirable to refer to oxygen concentration measurements in crystals grown in a previous time and then, to calculate or set a pressure in the furnace and a gas flow rate therein for a newly grown crystal. If a gas flow rate and a pressure in the furnace are set with reference to data of an interstitial oxygen concentration in a crystal pulled in a previous time, a portion in which a change in oxygen concentration is large can be stabilized to a desired value for certain and further, operating conditions can also be efficiently determined when various kinds of operating conditions are selected in order to control an oxygen concentration in the crystal. For example, in order to bring an oxygen concentration of all of a crystal close to a quality as a target, an oxygen concentration is brought close to the target value by adjusting a rotation speed of the crucible 7 and a magnetic field strength applied to the melt and then a deviation of an oxygen concentration from the target value difficult to eliminate by adjusting a crucible rotation speed and a magnetic field strength is further reduced by adjusting a pressure in the furnace and a gas flow; thereby, enabling a single crystal ingot having a desired quality to be grown with good reproducibility to a high precision.

EXAMPLES

Description will be given of experiments performed for confirmation of the effect of the invention and results thereof.

Comparative Example

Figure 2:
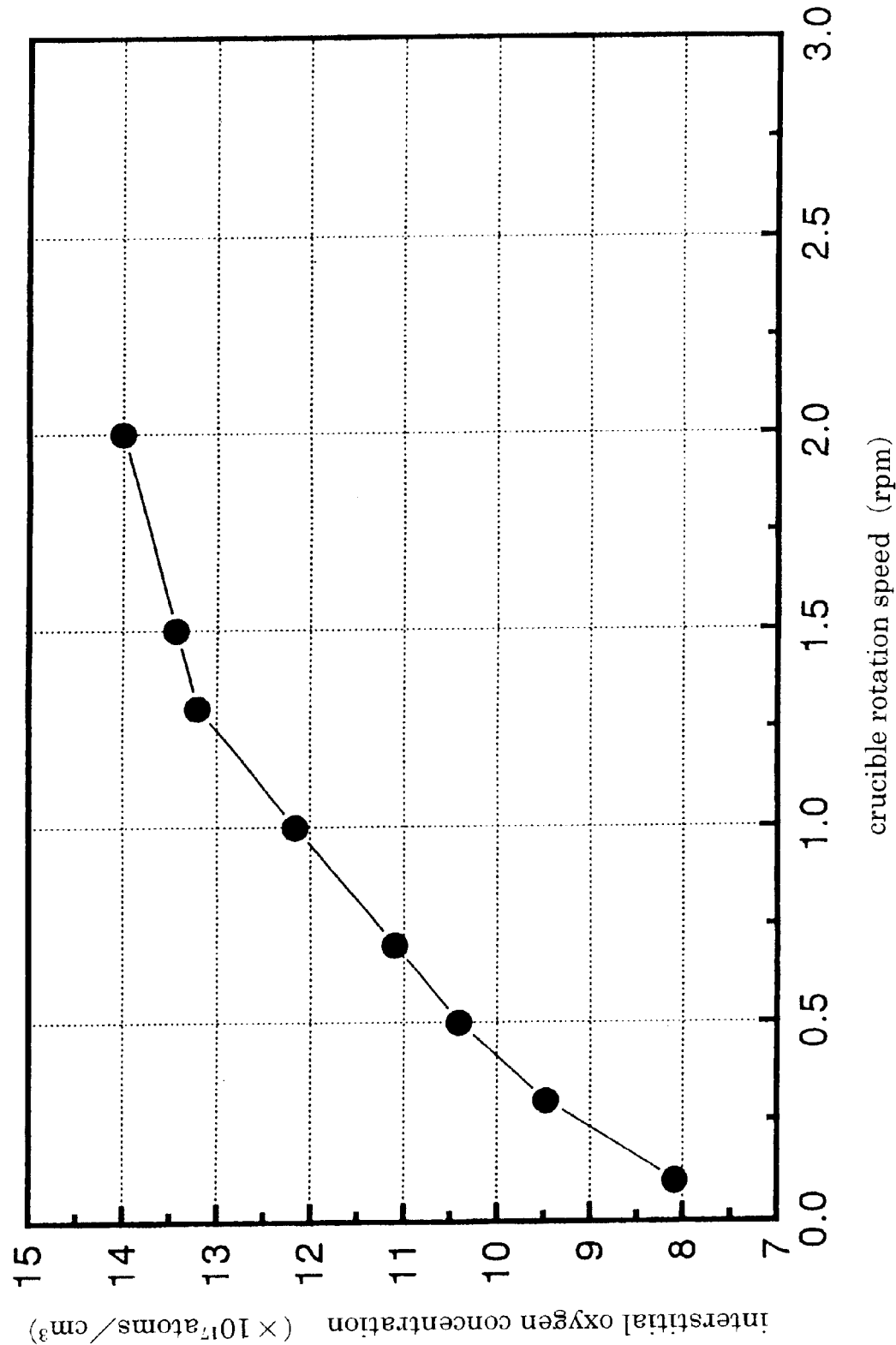
FIG. 2 is a graph showing a relationship between an interstitial oxygen concentration in a silicon single crystal and a rotation speed of a crucible.

First of all, an experiment was performed that confirms an influence of a rotation speed of a crucible on an interstitial oxygen concentration (this is a preliminary experiment for showing a comparative example). At first, a raw material polycrystalline silicon 150 kg was put into a quartz crucible of 24 inches in diameter, the polycrystalline silicon was melted into a silicon melt and the melt was applied with a horizontal magnetic field of 4000 G. Ar gas as an inert gas was caused to flow in the growth furnace, a seed crystal was dipped into the silicon melt and thereafter, seed squeezing was performed, followed by growth of a silicon single crystal of 200 mm in diameter. Growth conditions were as follows: an Ar gas flow rate was 100 l/min and a pressure in the furnace was 100 mbar, both being fixed values and on the other hand, crucible rotation speeds ranging from 0.1 to 2.0 rpm were selected to set one value for growth of each of 8 kinds of silicon single crystal ingots. After growth of each of the silicon single crystal ingots, a silicon wafer of 2 mm thick was cut out from the position of the constant diameter part in each of obtained silicon single crystal ingots and the silicon wafers were polished on both sides thereof to measure an interstitial oxygen concentration according to F-121 of ASTM(1979) using a Fourier transform infrared: FTIR spectrometer. Results of the measurement are shown in FIG. 2. It is found from the results that as a rotation speed of a crucible increases, an interstitial oxygen concentration in each silicon single crystal increases. This means that by adjusting a crucible rotation speed in company with progress in growth of a silicon single crystal (that is, with increase in growth length), an interstitial oxygen concentration can be controlled.

Example 1

Figure 3:
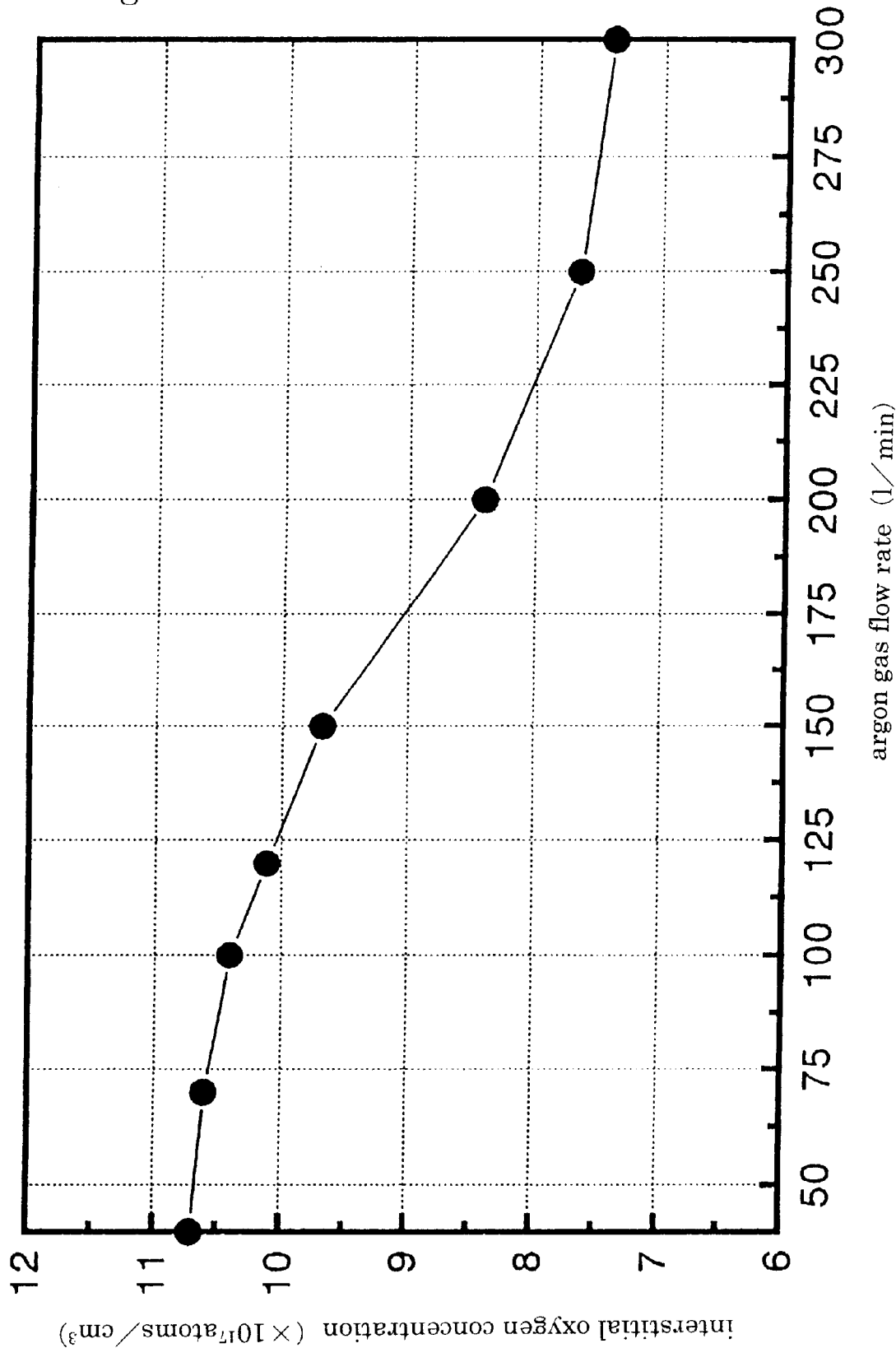
FIG. 3 a graph showing a relationship between an interstitial oxygen concentration in a silicon single crystal and a flow rate of argon gas flowing in a growth furnace.

Then, attention was focused on an amount of evaporation of oxygen from the surface of a silicon melt and investigation was performed about an influence of an argon gas flow rate in the growth furnace, which is thought will affect the amount of evaporation of oxygen, on an interstitial oxygen concentration in a silicon single crystal. Growth conditions for growth of silicon single crystals were almost the same as those for the comparative example, wherein a fixed crucible rotation speed was 0.5 rpm and a fixed pressure in the growth furnace was 100 mbar; and an argon gas flow rate was altered in various ways in the range of from 25 to 300 l/min. An interstitial oxygen concentration of each of silicon single crystal ingots obtained on the respective growth conditions was measured in a similar method to that of the comparative example. Results are shown in FIG. 3. It is found from the results that as an argon gas flow rate increases, an interstitial oxygen concentration in a silicon single crystal grown decreases. This means that, for example, by adjusting an argon gas flow rate in company with progress in growth of a silicon single crystal, an interstitial oxygen concentration can be controlled.

Example 2

Figure 4:
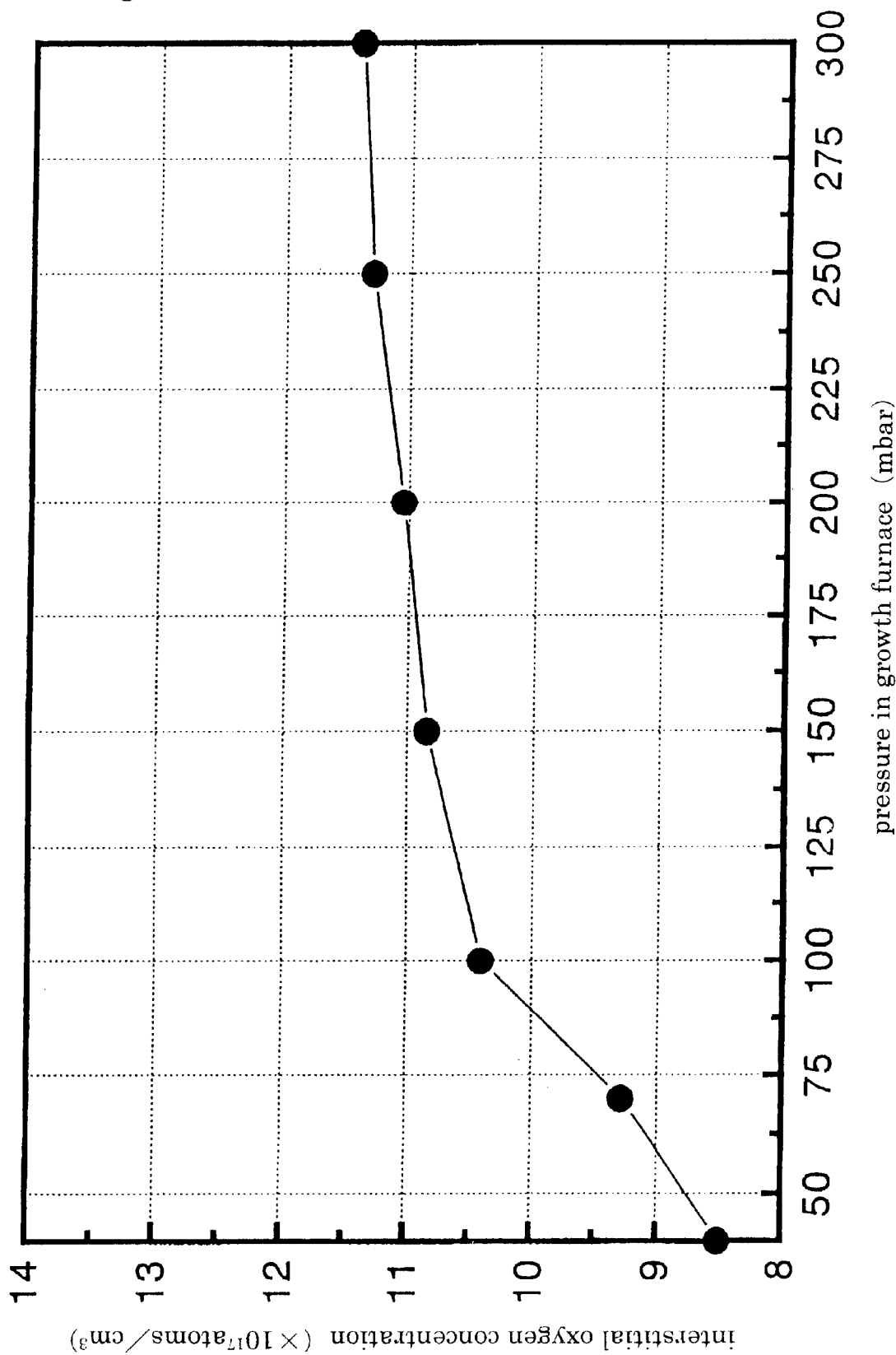
FIG. 4 is a graph showing a relationship between an interstitial oxygen concentration in a silicon single crystal and a pressure in a growth furnace.

Furthermore, since it was estimated that a pressure in the growth furnace was related with an amount of evaporation of oxygen from the surface of a silicon melt, investigation was performed about an influence of a pressure in the growth furnace on an interstitial oxygen concentration in a silicon single crystal obtained. Growth conditions for growth of silicon single crystals were almost the same as those for the comparative example, wherein a fixed crucible rotation speed was 0.5 rpm and a fixed argon gas flow rate was 100 l/min; and a pressure in the growth furnace was altered in various ways in the range of from 70 to 300 mbar. An interstitial oxygen concentration of each of silicon single crystal ingots obtained in the respective growth conditions was measured in a similar method as that of the comparative example. Results are shown in FIG. 4. It is found from the results that as a pressure in the growth furnace increases, an interstitial oxygen concentration in a silicon single crystal grown increases. This means that, for example, by adjusting a pressure in the growth furnace in company with progress in growth of a silicon single crystal, an interstitial oxygen concentration can be controlled.

Example 3

Pulling of a silicon single crystal was performed while a crucible rotation speed (the comparative example) or an argon gas flow rate and a pressure in the growth furnace are continuously altered in company with progress in growth length of the silicon single crystal and investigation was performed in an experiment about whether or not control was performed so as to attain an interstitial oxygen concentration along the growth axis direction at a constant value. As described above, a crucible rotation speed is thought as a factor giving an influence on thermal convection in a silicon melt in the crucible and an argon gas flow rate and a pressure in the growth furnace are thought as factors giving influences on evaporation of oxygen atoms from the surface of a silicon melt.

Figure 5:
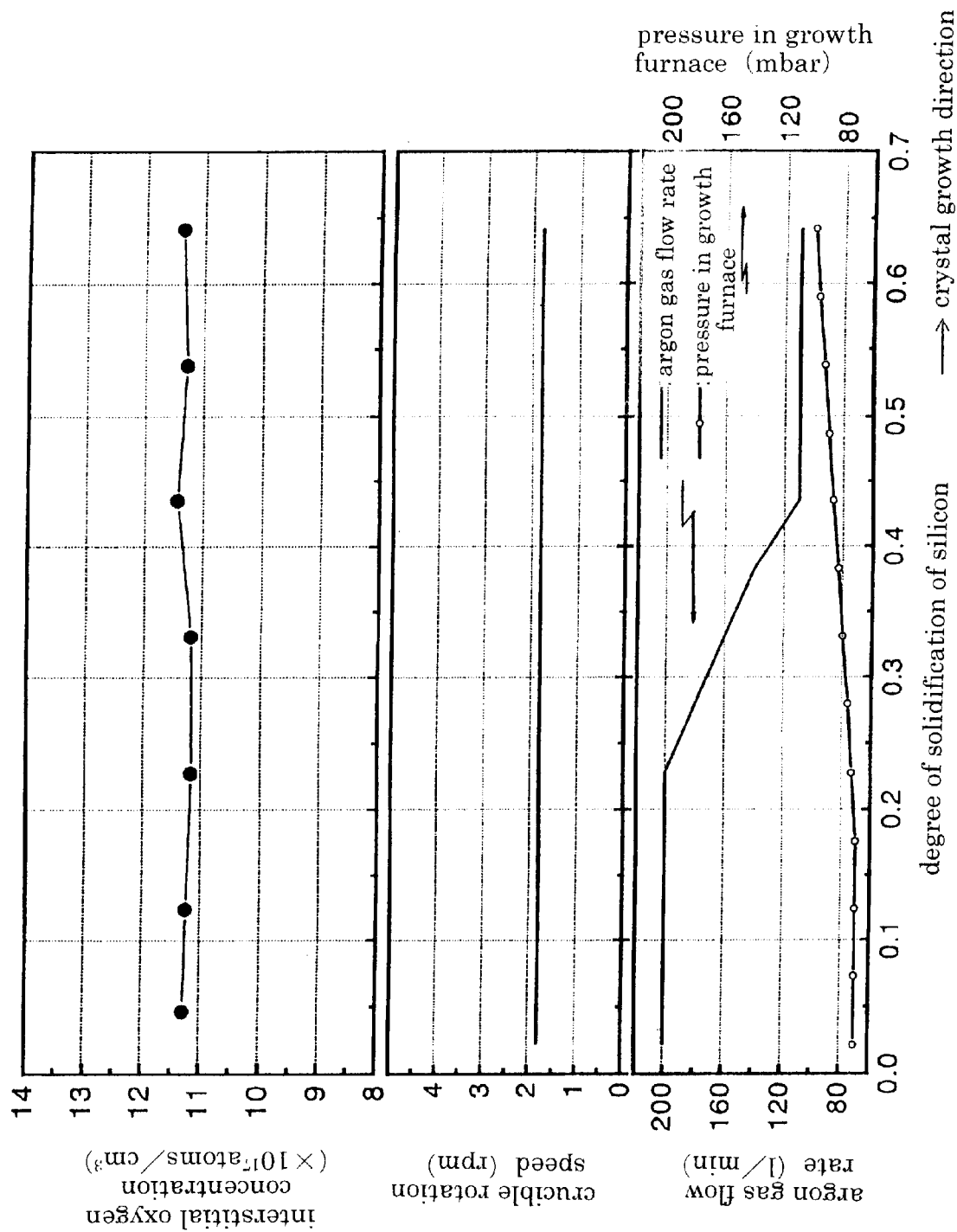
FIG. 5 is a graph showing a distribution profile of an interstitial oxygen concentration in the crystal growth axis direction in adjustment of an argon gas flow rate and a pressure in a growth furnace, as an example.
Figure 6:
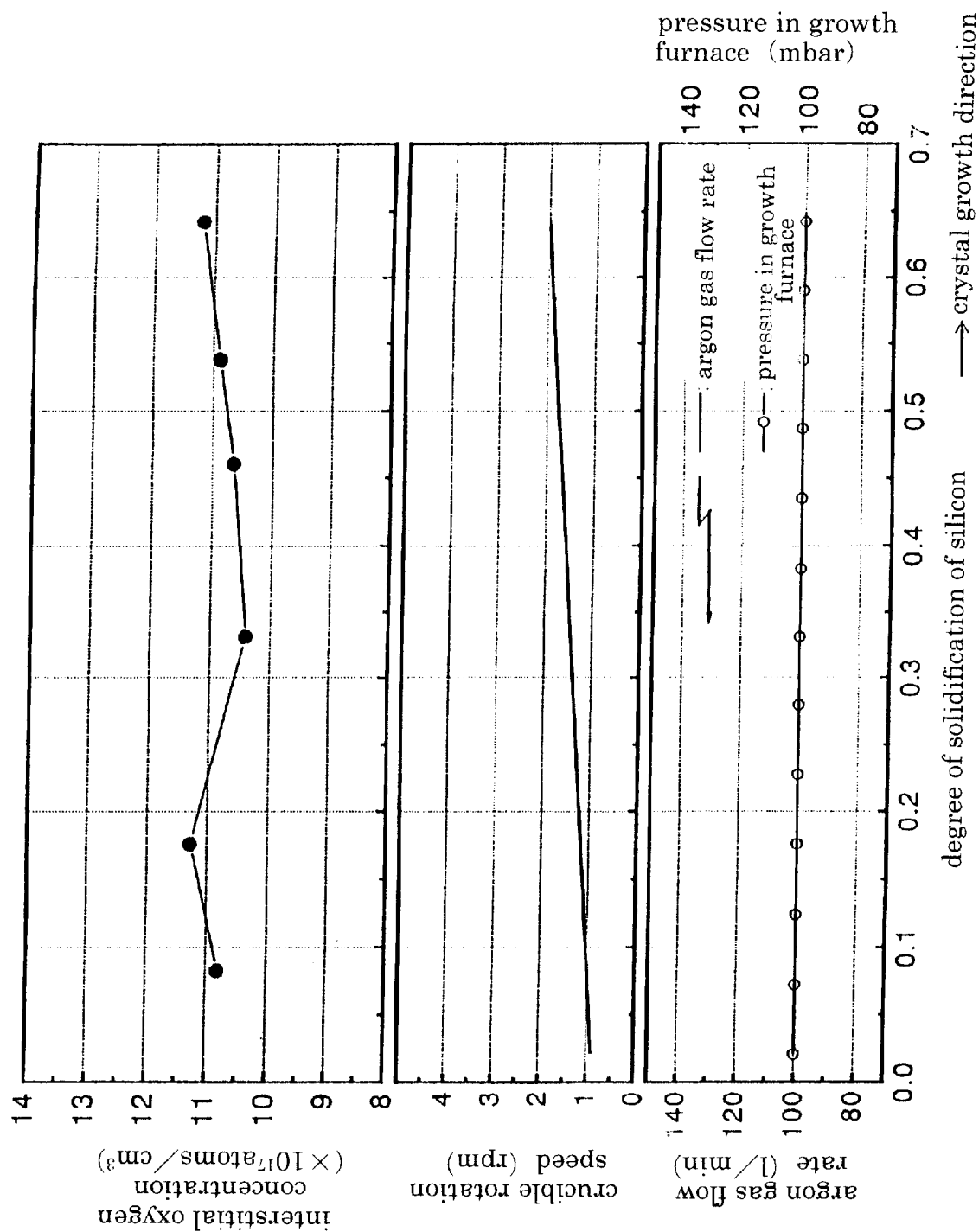
FIG. 6 is a graph showing a distribution profile of an interstitial oxygen concentration in the crystal growth axis direction when a rotation speed of a crucible holding a silicon melt is altered, as an example.

Pulling of the silicon crystal 8 was performed using the apparatus shown in FIG. 1, as an example, controlling both of an argon gas flow rate and a pressure in the growth furnace 1. An argon gas flow rate in the growth furnace 1 was adjusted by the flow rate controller 3 provided in the middle of the introduction pipe 11 and an argon gas flow rate was adjusted so as to decrease with progress in growth of the single crystal, that is with increase in degree of solidification of silicon. A pressure in the growth furnace 1 was controlled by changing a degree of opening of the conductance valve 4 provided in a part of the exhaust pipe 12 and a pressure in the furnace was adjusted so as to increase with progress in growth of the single crystal. That is, in the latter half of the crystal in growth, in order to compensate a decrease in amount of supply of oxygen to a silicon melt due to a decrease in contact area between the silicon melt and a quartz constituting the inner wall of a crucible, a flow rate of argon gas is reduced with progress in growth of the silicon single crystal while a pressure in the furnace is raised. Wafers were cut out from the thus obtained silicon single crystal at positions along the growth axis and an interstitial oxygen concentration in each wafer was measured according to the same method as described above. Results are shown in FIG. 5. It is found from the results that variations of an interstitial oxygen concentration along the crystal growth direction is confined within $\pm 0.14 \times 10^{17}$ atoms/cm$^3$ and the interstitial oxygen concentration is controlled with extremely high precision. Then, as a comparative example, pulling of a silicon single crystal 8 was performed under conditions that an argon gas flow rate and a pressure in the growth furnace 1 were fixed and a crucible rotation speed was variably controlled. To be concrete, a crucible rotation speed was gradually increased from 0.9 rpm to 2 rpm with progress in growth of the single crystal, that is with increase in degree of solidification of silicon. Thereafter, thus obtained silicon single crystal 8 was measured on an interstitial oxygen concentration at each of positions along the growth direction in a similar manner. Results are shown in FIG. 6. It is found from the results that while an almost uniform interstitial oxygen concentration distribution is macroscopically realized in the growth axis direction, to be detailed, an extent of variations in interstitial oxygen concentration distribution is large compared with the example shown in FIG. 5 and a difference between the maximum and the minimum is $\pm 0.44 \times 10^{17}$ atoms/cm$^3$, which is 3 or more times that of the example in FIG. 5.

That is, since, by application of a magnetic field with a MCZ method, a suppression force was given against generation of convection occurring in the silicon melt, a conspicuous change in speed of convection cannot be expected by adjustment of a crucible rotation speed differently from the comparative example and therefore, diffusion of oxygen atoms dissolved from quartz constituting a crucible wall toward a crystal growth interface is apt to be slowed down; therefore, the extent of variations in interstitial oxygen concentration distribution is considered to become large. Contrast to this, in the method of the example in which an inert gas flow rate flowing in the growth furnace or a pressure therein during growth of a silicon single crystal is altered according to increase in pulling amount of the silicon single crystal, evaporation of oxygen atoms from the surface of the silicon melt is suppressed, thereby enabling an oxygen atom concentration in the silicon melt to increase with no connection with a speed of convection. As a result, an effect is considered to be achieved that a delay in diffusion of dissolved oxygen atoms toward a crystal growth interface is effectively compensated and in turn an interstitial oxygen concentration distribution along the growth axis direction of thus obtained silicon single crystal becomes more uniform with more of stability.

Note that the above embodiment or examples are only illustrations of the invention and needless to say that the invention is not limited to those. For example, while, in the above embodiment, description is given mainly of growth of the silicon single crystal of 200 mm in diameter, that is an 8 inch single crystal as an example, the invention can be applied to, for example, growth of single crystals of diameters of 10 inches, 12 inches (about 300 mm) and furthermore, 16 inches (about 400 mm) or more in a similar manner. Any of embodiments or examples having essentially the same constitution as that from a technical concept included in appended claims of the invention and exerting an action and effect similar to the technical concept is included in the technical scope of the invention. The above embodiment or examples can be improved or altered in various ways as far as not departing from the essentials of the invention.

What is claimed is:

1. A manufacturing method for a silicon single crystal from a silicon melt contained in a crucible in a silicon single crystal growth furnace by a CZ method in which not only is a MCZ method (a magnetic field applied pulling method) performing single crystal pulling under application of a magnetic field adopted, but also a flow rate of an inert gas flowing in the growth furnace during growth of the silicon single crystal and a pressure in the growth furnace are altered, or either the flow rate of an inert gas or the pressure in the growth furnace is altered, according to a pulling amount of the silicon single crystal to adjust an interstitial oxygen concentration therein.

2. The manufacturing method for a silicon single crystal according to claim 1, wherein the flow rate of the inert gas is reduced as a pulling amount of the silicon single crystal increases.

3. The manufacturing method for a silicon single crystal according to claim 2, wherein the flow rate of said inert gas flowing in the single crystal growth furnace during growth of the silicon single crystal is adjusted in the range of from 40 to 300 l/min.

4. The manufacturing method for a silicon single crystal according to claim 3, wherein the inert gas is argon gas.

5. The manufacturing method for a silicon single crystal according to claim 2, wherein the inert gas is argon gas.

6. The manufacturing method for a silicon single crystal according to claim 2, wherein the flow rate of the inert gas and the pressure in the single crystal growth furnace are altered, or either the flow rate of the inert gas or the pressure in the single crystal growth furnace is altered matching with a pulling amount of the silicon single crystal is calculated and set based on measurements of an interstitial oxygen concentration in a silicon single crystal which has been previously pulled.

7. The manufacturing method for a silicon single crystal according to claim 1, wherein the flow rate of said inert gas flowing in the single crystal growth furnace during growth of the silicon single crystal is adjusted in the range of from 40 to 300 l/min.

8. The manufacturing method for a silicon single crystal according to claim 7, wherein the inert gas is argon gas.

9. The manufacturing method for a silicon single crystal according to claim 1, wherein the inert gas is argon gas.

10. The manufacturing method for a silicon single crystal according to claim 1, wherein the pressure in the single crystal growth furnace is increased with increase in pulling amount of the silicon single crystal.

11. The manufacturing method for a silicon single crystal according to claim 10, wherein the pressure in the single crystal growth furnace during growth of the silicon single crystal is adjusted in the range of from 40 to 300 mbar.

12. The manufacturing method for a silicon single crystal according to claim 7, wherein the flow rate of the inert gas and the pressure in the single crystal growth furnace are altered, or either the flow rate of the inert gas or the pressure in the single crystal growth furnace is altered matching with a pulling amount of the silicon single crystal is calculated and set based on measurements of an interstitial oxygen concentration in a silicon single crystal which has been previously pulled.

13. The manufacturing method for a silicon single crystal according to claim 1, wherein the pressure in the single crystal growth furnace during growth of the silicon single crystal is adjusted in the range of from 40 to 300 mbar.

14. The manufacturing method for a silicon single crystal according to claim 1, wherein the magnetic field applied to a silicon melt in the single crystal growth furnace growing the silicon single crystal therein has a strength of 3000 G or higher at a position where said magnetic field reaches the maximum strength thereof.

15. The manufacturing method for a silicon single crystal according to claim 1, wherein the flow rat of the inert gas and the pressure in the single crystal growth furnace are altered, or either the flow rate of the inert gas or the pressure in the single crystal growth furnace is altered matching with a pulling amount of the silicon single crystal is calculated and set based on measurements of an interstitial oxygen concentration in a silicon single crystal which has been previously pulled.

16. A silicon single crystal of 200 mm or more in diameter grown using a CZ method pulling the single crystal from a silicon melt having a variation in interstitial oxygen concentration at a center of a crystal growth axis along a crystal growth axis direction confined within $\pm 0.2 \times 10^{17}$ atoms/cm$^3$ of the average thereof.

17. The silicon single crystal according to claim 16, grown by use of a MCZ method performing single crystal pulling under application of a magnetic field to a silicon melt.

* * * * *

UNITED STATES PATENT AND TRADEMARK OFFICE
CERTIFICATE OF CORRECTION

PATENT NO. : 6,592,662 B2
DATED : July 15, 2003
INVENTOR(S) : Izumi Fusegawa et al.

It is certified that error appears in the above-identified patent and that said Letters Patent is hereby corrected as shown below:

<u>Column 16,</u>
Line 4, delete "rat" and substitute therefore -- rate --

Signed and Sealed this

Twenty-third Day of December, 2003

JAMES E. ROGAN
*Director of the United States Patent and Trademark Office*